(12) United States Patent
Kanryo et al.

(10) Patent No.: US 8,016,184 B2
(45) Date of Patent: Sep. 13, 2011

(54) METHOD FOR MANUFACTURING ELECTRONIC COMPONENT MODULE

(75) Inventors: Koichi Kanryo, Otsu (JP); Akio Katsube, Moriyama (JP); Akira Tanaka, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/887,542

(22) Filed: Sep. 22, 2010

(65) Prior Publication Data

US 2011/0006106 A1 Jan. 13, 2011

Related U.S. Application Data

(63) Continuation of application No. PCT/JP2009/055092, filed on Mar. 17, 2009.

(30) Foreign Application Priority Data

Mar. 24, 2008 (JP) ................................ 2008-076539
Jan. 9, 2009 (JP) ................................ 2009-003615

(51) Int. Cl.
*B23K 31/02* (2006.01)
*B05D 5/12* (2006.01)

(52) U.S. Cl. .................... 228/214; 228/248.1; 427/96.2; 427/96.3

(58) Field of Classification Search ........................ None
See application file for complete search history.

(56) References Cited

U.S. PATENT DOCUMENTS

| 2007/0040176 | A1* | 2/2007 | Kato et al. ...................... 257/66 |
| 2007/0071886 | A1* | 3/2007 | Babb et al. ................... 427/96.3 |
| 2009/0091907 | A1* | 4/2009 | Huang et al. ................... 361/818 |
| 2009/0324906 | A1* | 12/2009 | Marcoux ........................ 428/201 |
| 2010/0015329 | A1* | 1/2010 | Nguyen et al. ............... 427/96.2 |
| 2010/0051343 | A1* | 3/2010 | Lam ............................... 174/350 |
| 2011/0084369 | A1* | 4/2011 | Eder et al. ..................... 257/666 |

FOREIGN PATENT DOCUMENTS

| JP | 11-163583 A | 6/1999 |
| JP | 2003-318324 A | 11/2003 |
| JP | 2004-172176 A | 6/2004 |
| JP | 2005-79139 A | 3/2005 |

OTHER PUBLICATIONS

Official Communication issued in International Patent Application No. PCT/JP2009/055092, mailed on Apr. 14, 2009.

* cited by examiner

*Primary Examiner* — Kiley Stoner
(74) *Attorney, Agent, or Firm* — Keating & Bennett, LLP

(57) ABSTRACT

A method for manufacturing an electronic component module is performed such that a shield layer can be formed as a thin film and an electronic component can be effectively shielded. A collective substrate including a plurality of electronic component modules including a plurality of electronic components is batch-sealed with a resin. A cut section is formed from a top surface of the sealed resin to a position that reaches a grounding electrode arranged in the substrate at a boundary section of the electronic component module so as to expose the grounding electrode. A conductive paste is applied on side surfaces and the top surface. Then, a conductive thin film is formed by spin coating, and the electronic component module is cut.

3 Claims, 10 Drawing Sheets

METHOD FOR MANUFACTURING ELECTRONIC COMPONENT MODULE

BACKGROUND OF THE INVENTION

1. Field of the Invention

The present invention relates to a method for manufacturing an electronic component module, in which an electronic component module including a grounding electrode extending around the bottom thereof is cut from a collective substrate with a plurality of electronic component modules including a plurality of electronic components.

2. Description of the Related Art

Conventionally, when manufacturing an electronic component module, a collective substrate including a variety of electronic components is batch-sealed with a resin, and a groove (cut) section is formed from a top surface of the sealed resin to a position that reaches a grounding electrode, at a boundary section for cutting into electronic component modules. Then, after filling the groove section with a conductive paste, individual electronic component module units are cut from the boundary section, thereby manufacturing electronic component modules (see Japanese Patent Application Laid-Open No. 2004-172176).

However, in the manufacturing method disclosed in Japanese Patent Application Laid-Open No. 2004-172176, unless the groove section is to be filled with a relatively large amount of conductive paste with a relatively small viscosity in order to fill the groove section with the conductive paste, the bottom of the groove section may be incompletely filled or filled with the conductive paste including air bubbles. In this case, as the conductive paste is generally a thermosetting resin, voids will likely occur within the resin layer during curing, leading to a problem in that the electronic components may be insufficiently shielded from electric field noises and electromagnetic wave noises.

Furthermore, in order to avoid the problem mentioned above, a diluted solution of the conductive paste is often used to lower the viscosity of the conductive paste. However, in this case, the diluted solution may be gasified during curing of the thermosetting resin, which results in voids within the resin layer due to gas from the vaporization of the diluted solution. Therefore, the use of the diluted solution does not effectively solve the problem that the electronic components may be insufficiently shielded from electric field noises and electromagnetic wave noises.

Thus, for example, in Japanese Patent Application Laid-Open No. 11-163583, a thin-film shield layer defined by a nickel plating layer or other suitable layer is formed instead of the conductive paste. The nickel plating layer is easily formed into a thin film, which is formed by immersing a base material in a plating solution to induce metal precipitation on the surface. Thus, no air bubbles will be included in the film, unlike the case of the paste application, thereby preventing voids from occurring.

Moreover, Japanese Patent Application Laid-Open No. 2005-79139 discloses a method for forming a shield layer by spray coating. Since the spray coating forms a thin film shield layer, air bubbles are not likely to be included in the shield layer, as in the case of Japanese Patent Application Laid-Open No. 11-163583, thereby preventing voids from occurring.

However, the manufacturing method disclosed in Japanese Patent Application Laid-Open No. 11-163583 requires the immersion of the electronic component package in a plating solution in order to form the shield layer of a nickel plating layer. Therefore, the immersion in the plating solution may cause the plating solution to penetrate into the sealed resin, which may lead to a problem of damage to the electronic components due to the plating solution and decreased reliability due to water absorption by the sealed resin.

Furthermore, in Japanese Patent Application Laid-Open No. 2005-79139, in the case of batch-shielding a plurality of modules, it is difficult to form the shield layer uniformly on side surfaces of the packages unless the groove section between the packages has a sufficiently large width, which leads to a problem that the electronic components may be insufficiently shielded from electric field noises and electromagnetic wave noises. Furthermore, in the case of spray coating, because a highly flammable conductive resin is sprayed, facilities are required to have explosion-proof specifications, which leads to the problem of high production cost.

SUMMARY OF THE INVENTION

To overcome the problems described above, preferred embodiments of the present invention provide a method for manufacturing an electronic component module, by which a shield layer can be formed as a thin film and an electronic component can be effectively shielded.

A preferred embodiment of the present invention provides a method for manufacturing an electronic component module, including batch-sealing, with a resin, a collective substrate with a plurality of electronic component modules defined by a plurality of components, forming a cut section from a top surface of the sealed resin to a position that reaches a grounding electrode arranged in the substrate, at a boundary section of the electronic component module, and applying a conductive paste on side surfaces and the top surface of the electronic component modules, and then cutting the electronic component modules, wherein a conductive thin film is formed by spin coating after applying the conductive paste.

In the method for manufacturing an electronic component module, a cross-sectional shape in a direction substantially perpendicular to the cut section at the bottom of the cut section is preferably a curved shape or a shape with a predetermined slope, for example.

In the method for manufacturing an electronic component module, the grounding electrode of the collective substrate that is exposed by the formation of the cut section is provided on each of four side surfaces of the electronic component module.

The collective substrate including the plurality of electronic component modules defined by the plurality of electronic components is preferably batch-sealed with a resin, and the cut section is formed from the top surface of the sealed resin to the position that reaches the grounding electrode arranged in the substrate, at the boundary section of the electronic component module. After applying the conductive paste on the side surfaces and the top surface, the conductive paste formed on the side surfaces and top surface of the electronic component module can be made into a thin film (for example, about 5 μm to about 15 μm) by spin coating, so as to produce an electronic component module having a lower profile. Furthermore, since the conductive paste filling the cut section can be also made into a thin film, no voids occur due to vaporization of a diluted solution of the paste in a thermal curing treatment or due to air bubbles remaining in the paste. Therefore, the elimination of a portion having no shield layer formed thereon allows the electronic components to be sufficiently shielded from electric field noises and electromagnetic wave noises. Moreover, similar effects can also be expected in the case of electronic components disposed on an upper surface and a lower surface of the substrate.

The cross-sectional shape in a direction substantially perpendicular to the cut section at the bottom of the cut section is preferably a curved shape or a shape with a predetermined slope. Thus, a portion with no conductive paste is prevented from occurring when filling the cut section with the conductive paste, thereby preventing the occurrence of voids.

The grounding electrode of the collective substrate, which is exposed by the formation of the cut section, is preferably provided on each of four side surfaces of the electronic component module, thereby allowing the electronic components to be sufficiently shielded from electric field noises and electromagnetic wave noises. Furthermore, while a difference occurs due to the spin coating in the thickness of the film applied on the cut sections between the direction toward the center of rotation and the direction along the periphery, the grounding electrodes are formed on the four side surfaces, thereby allowing the shielding property for the electronic components, the internal wirings, and other elements of the electronic component module to be improved.

With the structure described above, after applying the conductive paste on the side surfaces and the top surface of the electronic component module, the conductive paste formed on the side surfaces and top surface of the electronic component module can be made into a thin film (for example, about 5 μm to about 15 μm) by spin coating, so as to produce an electronic component module having a lower profile. Furthermore, since the conductive paste filling the cut section can be also made into a thin film, no voids occur due to vaporization of a diluted solution of the paste in thermal curing or due to air bubbles remaining in the paste, allowing the electronic components to be sufficiently shielded from electric field noises and electromagnetic wave noises.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1:
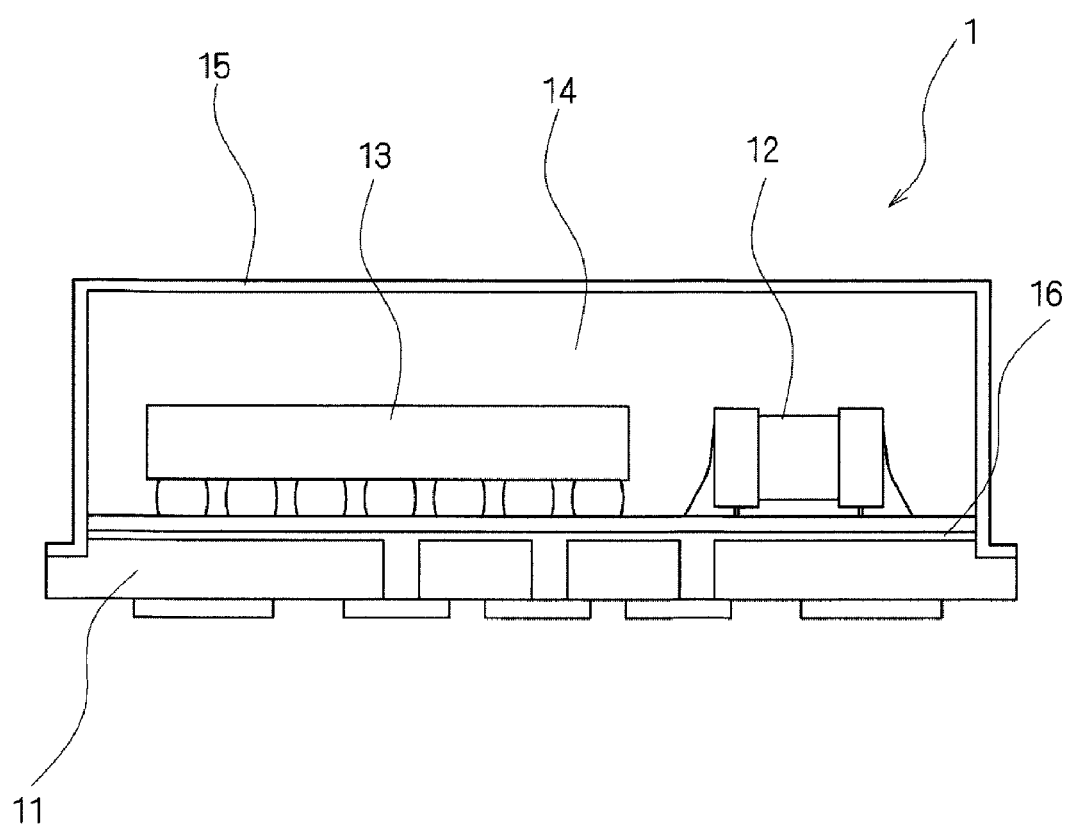
FIG. 1 is a cross-sectional view illustrating the structure of an electronic component module according to a first preferred embodiment of the present invention.

FIG. 1 is a cross-sectional view illustrating the structure of an electronic component module according to a first preferred embodiment of the present invention. The electronic component module 1 according to the first preferred embodiment of the present invention preferably has, for example, dimensions of about 10.0 mm×about 10.0 mm×about 1.2 mm, and includes a circuit substrate 11 including ceramics, glass, an epoxy resin, or other suitable material, and electronic components 12 and 13, such as semiconductor elements, capacitors, resistors, SAW filters, for example, which are disposed on a surface of the circuit substrate 11.

The circuit substrate 11 is preferably, for example, a resin substrate having a rectangular upper surface and a thickness of approximately 0.6 mm, for example. The surface of the circuit substrate 11 is provided with a signal pattern (not shown) which also defines a junction pad with the electronic components 12 and 13 and with a grounding electrode 16 adjacent to the circuit substrate 11. The signal pattern of the circuit substrate 11 is preferably connected to the terminals of the electronic components 12 and 13, such as each semiconductor element, capacitor, and resistor, by bonding wires, solder, or other suitable connection, for example.

A sealed resin layer 14 preferably made of a synthetic resin, for example, is provided on an upper surface of the circuit substrate 11 so as to cover the circuit substrate 11 and the electronic components 12 and 13. A shield layer 15 is provided on a surface of the sealed resin layer 14 to shield the electronic components 12 and 13 from electric field noises and electromagnetic wave noises.

Figure 2:
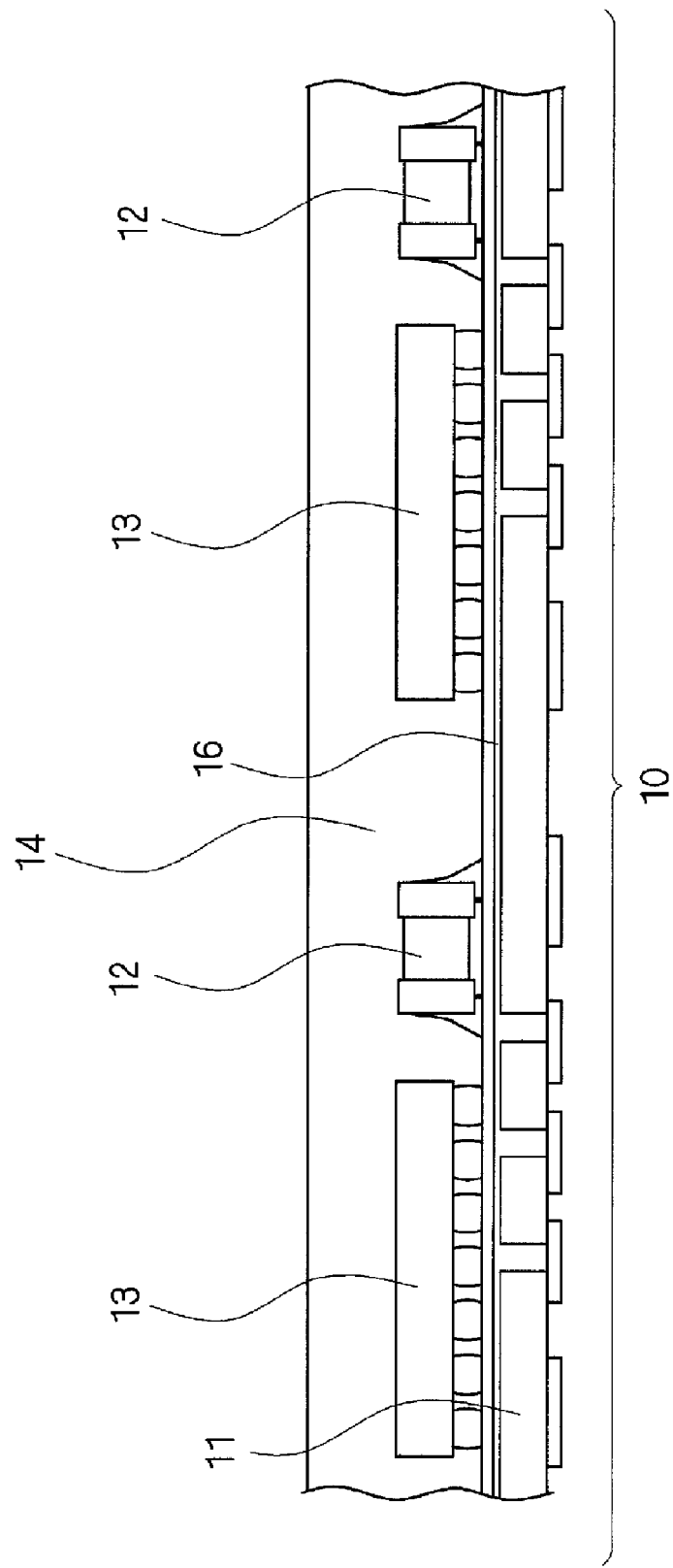
FIG. 2 is cross-sectional view illustrating electronic component modules with a sealed resin layer according to the first preferred embodiment of the present invention.

FIGS. 2 through 6 are cross-sectional views for describing a method for manufacturing the electronic component module 1 according to the first preferred embodiment of the present invention. First, a sealed resin layer 14 preferably made of a synthetic resin, for example, is formed so as to cover an upper portion of a collective substrate 10 from which a plurality of circuit substrates 11 including a plurality of electronic components 12 and 13 can be cut. FIG. 2 is cross-sectional view illustrating electronic component modules 1 with the sealed resin layer 14 formed thereon according to the first preferred embodiment of the present invention.

In FIG. 2, the sealed resin layer 14 is formed so as to cover the upper portion of the collective substrate 10 from which the plurality of circuit substrates 11 including the plurality of electronic components 12 and 13 can be cut. For the sealed resin layer 14, a liquid synthetic resin such as an epoxy resin is preferably applied by a dispenser, applied by vacuum printing, or molded by using a transfer molding method, for example, to perform batch sealing with the resin. The sealing for the circuit substrates 11 and the electronic components 12 and 13 forms an insulating layer.

Figure 3:
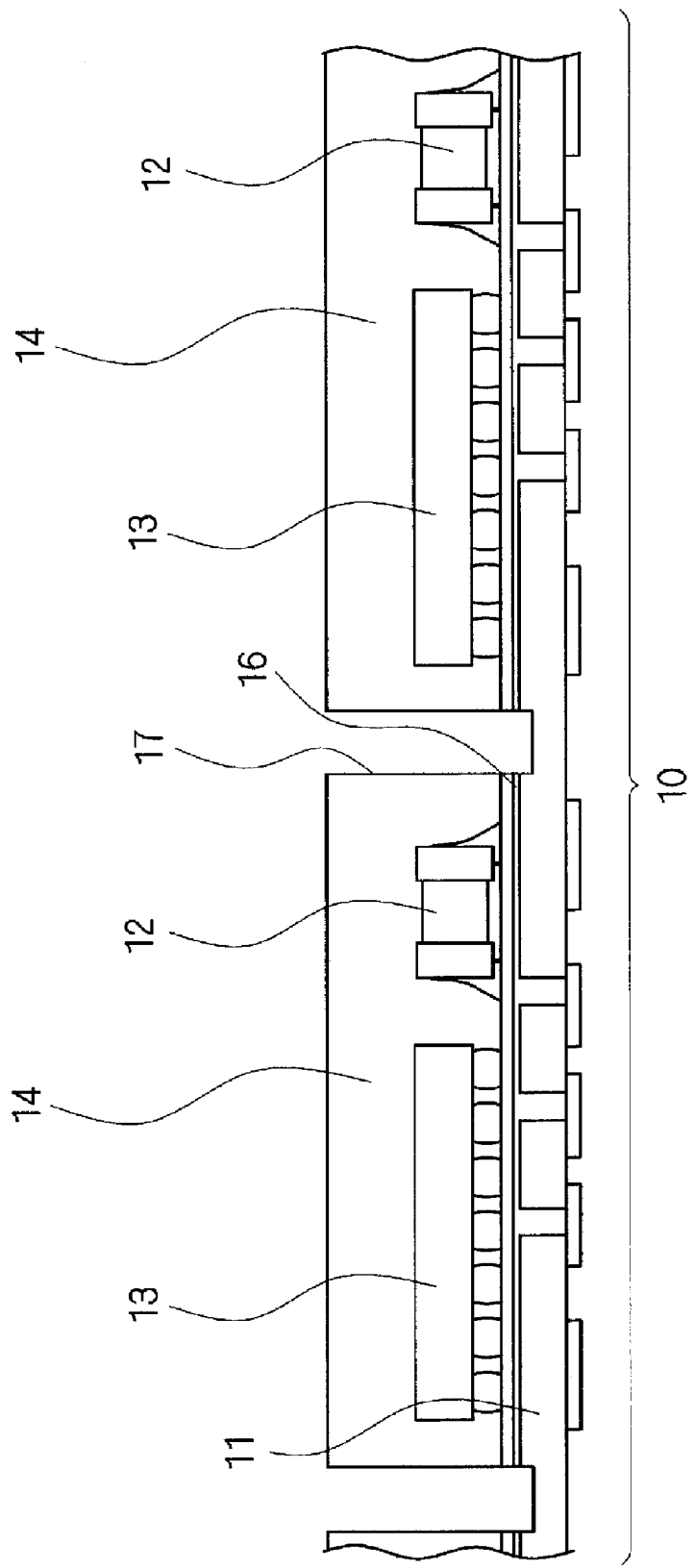
FIG. 3 is cross-sectional view illustrating the electronic component modules with cut sections according to the first preferred embodiment of the present invention.

Next, groove-shaped cut sections are formed using a blade or other suitable tool at boundary sections for cutting the electronic component modules 1, so as to reach a depth in the approximate middle of the circuit substrate 11, at which the grounding electrodes 16 are exposed. FIG. 3 is cross-sectional view illustrating the electronic component modules with cut sections 17 formed therein, according to the first preferred embodiment of the present invention.

In FIG. 3, the groove-shaped cut sections 17 are formed at the boundary sections of the electronic component modules 1 to a depth at which the grounding electrodes 16 are exposed. The formation of the cut sections allows the grounding electrodes 16 to be effectively exposed and to be conductively connected to a conductive paste.

Figure 4:
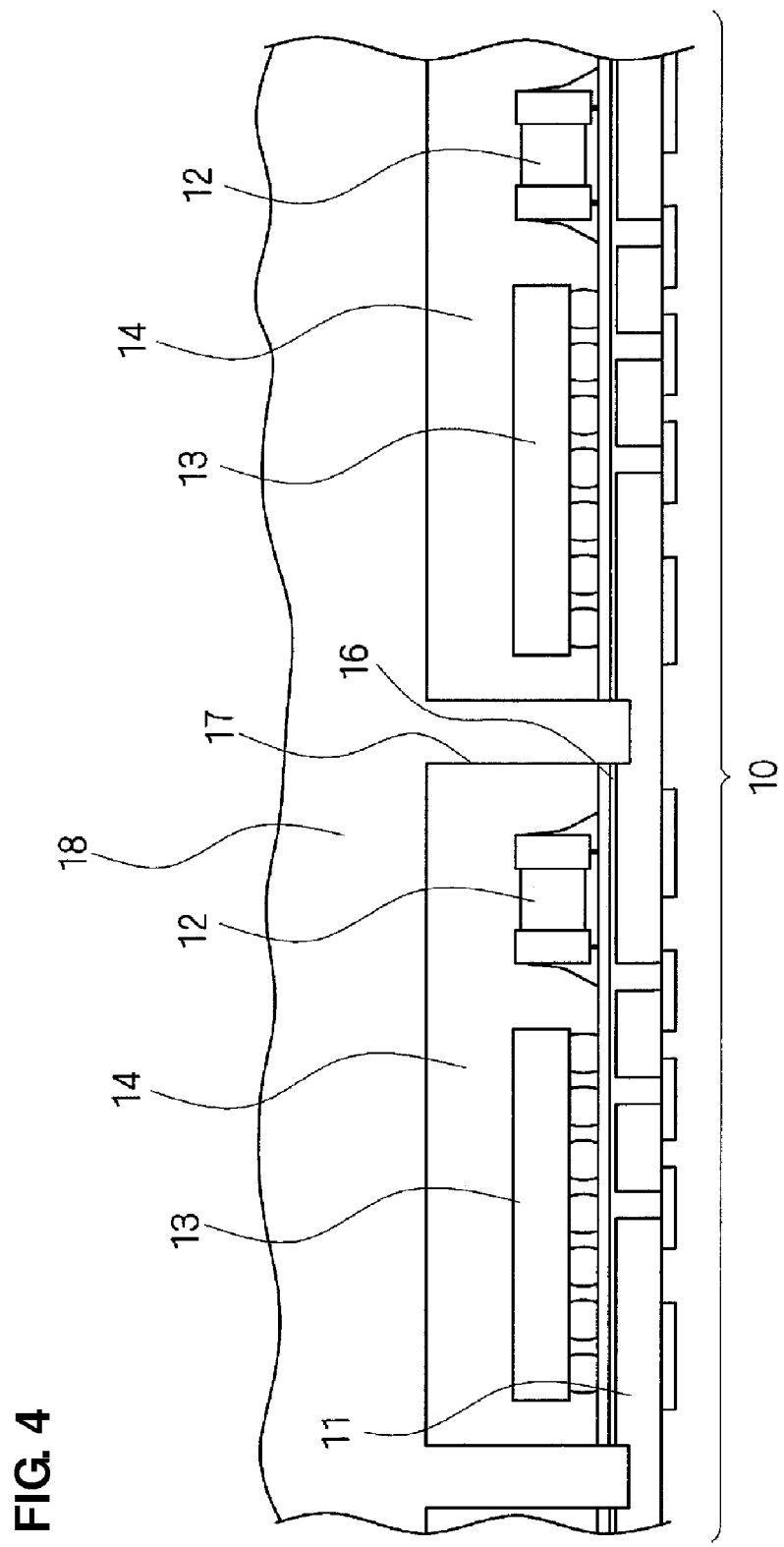
FIG. 4 is cross-sectional view illustrating the electronic component modules with a conductive paste according to the first preferred embodiment of the present invention.

Next, a conductive paste is applied to the external surface of the electronic component modules 1, including the cut sections 17, using a dispenser, a jet dispenser, a vacuum printing apparatus, or other suitable device, for example. FIG. 4 is cross-sectional view illustrating the electronic component modules with a conductive paste formed thereon, according to the first preferred embodiment of the present invention. As shown in FIG. 4, the shielding property can be improved by applying a conductive paste 18 such that the inside of the cut sections 17 is adequately filled with the conductive paste 18. More specifically, the conductive connection of the conductive paste to the grounding electrodes 16 ensures the shielding property for the internal wirings of the mounted electronic components 12 and 13.

The conductive component in the conducive paste 18 is preferably, for example, Ag, Cu, Ni, or other suitable material, and the synthetic resin contained in the conductive paste 18 is preferably, for example, an epoxy resin, a phenol resin, a urethane resin, a silicon resin, a polyester resin, an acrylic resin, a polyimide resin, or other suitable resin material.

Figure 5:
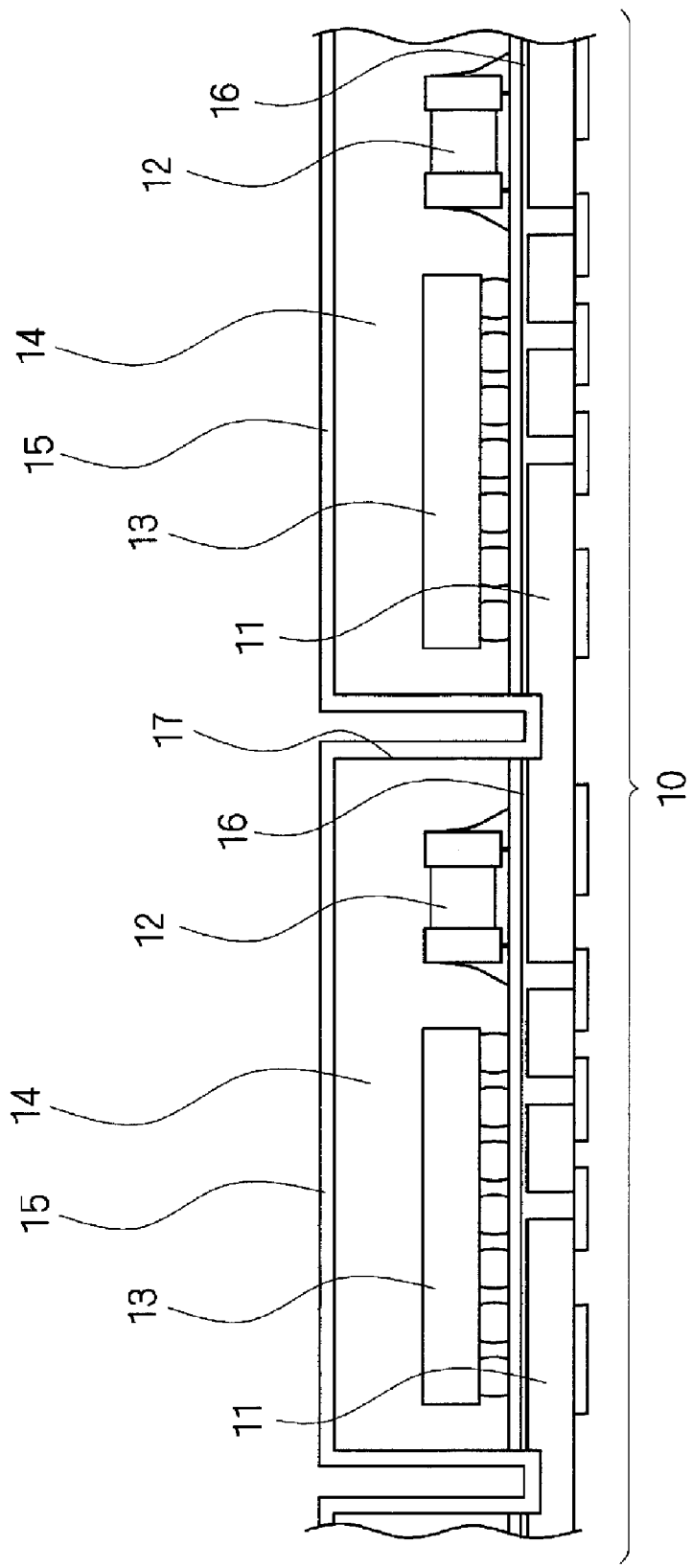
FIG. 5 is cross-sectional view illustrating the electronic component modules with a shield layer according to the first preferred embodiment of the present invention.

Next, a thin film shield layer is preferably formed by spin coating the conductive paste 18 using a spin coater. FIG. 5 is cross-sectional view illustrating the electronic component modules with a shield layer 15 formed thereon, according to the first preferred embodiment of the present invention. In FIG. 5, before subjecting the conductive paste 18 to a thermal curing treatment, the electronic component modules are disposed on the spin coater, and the conductive paste 18 is formed into a thin film by a centrifugal force due to the rotation of the spin coater. The thin film is subjected to the thermal curing treatment to form the shield layer 15.

Figure 7:
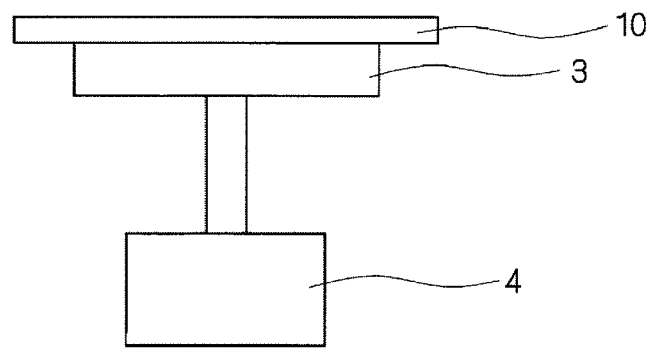
FIG. 7 is a diagram schematically illustrating as an example a spin coater for applying a spin coat treatment to circuit substrates and electronic components with the conductive paste applied thereto.

FIG. 7 is diagram schematically illustrating an example of a spin coater for applying a spin coat treatment to the circuit substrates 11 and the electronic components 12 and 13 with the conductive paste 18 applied thereto. A disk-shaped rotor 3 is connected to a motor 4, which enables the rotor 3 to rotate in a predetermined rotation direction and at a predetermined rotation speed. The collective substrate 10 as shown in FIG. 5 is disposed on the rotor 3.

With the collective substrate 10 as shown in FIG. 4 being disposed on the rotor 3, the rotor 3 is rotated by the motor 4. The centrifugal force generated by the rotation of the rotor 3 eliminates the unnecessary conductive paste 18 filling the circuit substrates 11 and the electronic components 12 and 13, and forms a conductive thin film on the external surface including the cut sections 17, resulting in the state shown in FIG. 5.

Then, the shield layer 15 preferably having a film thickness of about 5 µm to about 15 µm, for example, is formed by subjecting the conductive thin film to drying and thermal curing using an oven or other suitable drying and curing device. The film thickness can be arbitrarily controlled by changing the number of rotations and the time of rotation of the motor 4 of the spin coater. The film thickness may be set thicker if the shielding property is a priority, whereas the film thickness may be set thinner if the lower profile is a priority.

Figure 6:
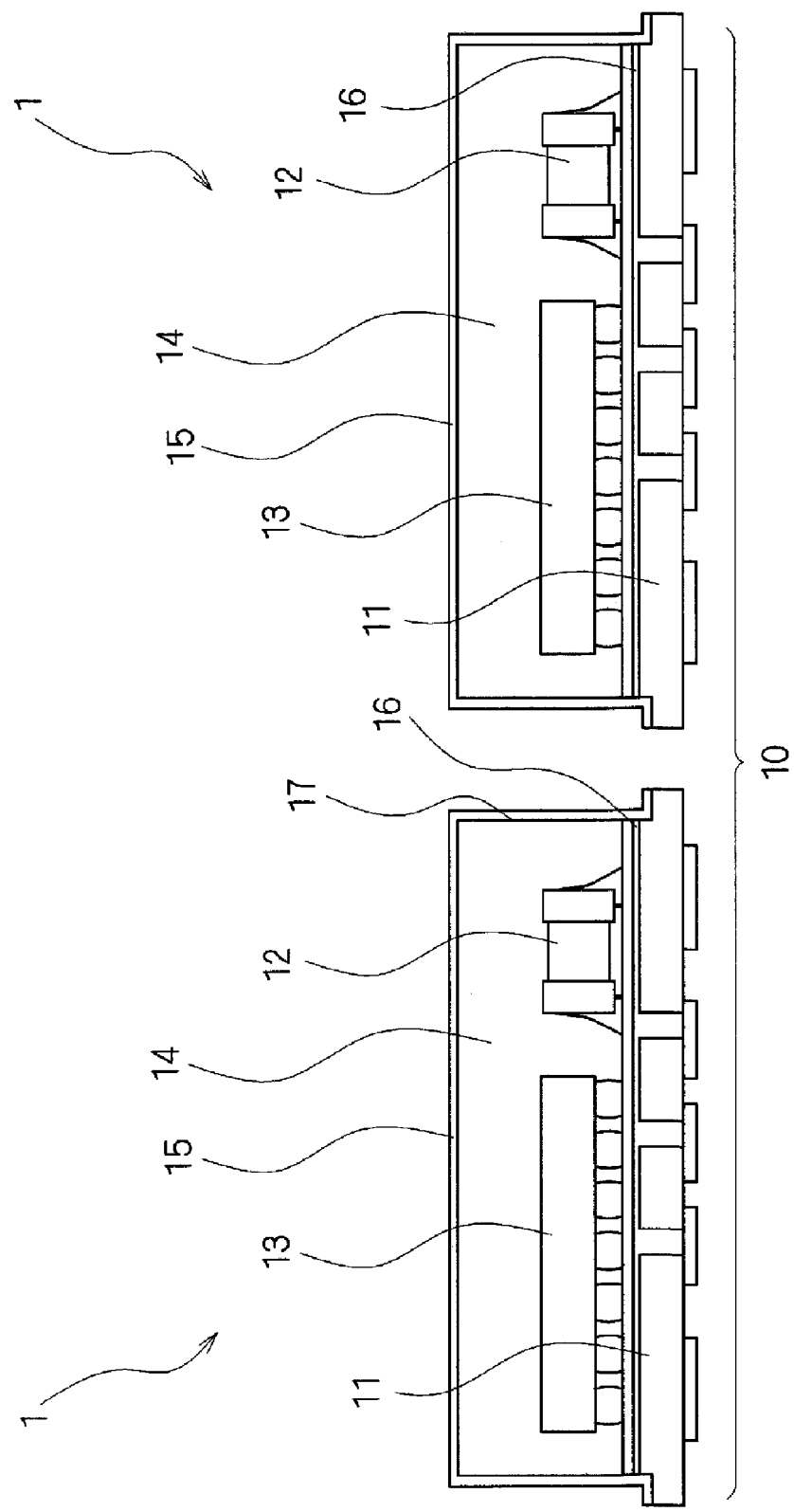
FIG. 6 is cross-sectional view illustrating the divided electronic component modules according to the first preferred embodiment of the present invention.

Then, collective substrate 10 is divided at the cut sections 17 into the individual electronic component modules 1. FIG. 6 is cross-sectional view illustrating the divided electronic component modules 1 according to the first preferred embodiment of the present invention. In FIG. 6, the cut sections being further extended results in the division into the individual electronic component modules 1.

As described above, according to the first preferred embodiment, the use of spin coat after the application of the conductive paste 18 on side surfaces and a top surface of the electronic component modules 1 enables the conductive paste 18 applied on the side surfaces and the top surface of the electronic component modules to be formed into a thin film, resulting in a reduction in the generation of gas from vaporization of a diluted solution and gas from a curing reaction of a conductive paste, which are generated in thermal curing. In addition, the small film thickness permits the gases to easily escape therefrom even when these gases are generated, thus preventing the occurrence of voids during the thermal curing. Furthermore, the spin coat requires a short time period of approximately 30 s, for example, which increases productivity, and only requires the use of simple and inexpensive equipment, such as a spin coater, thereby reducing production costs.

Second Preferred Embodiment

Figure 8:
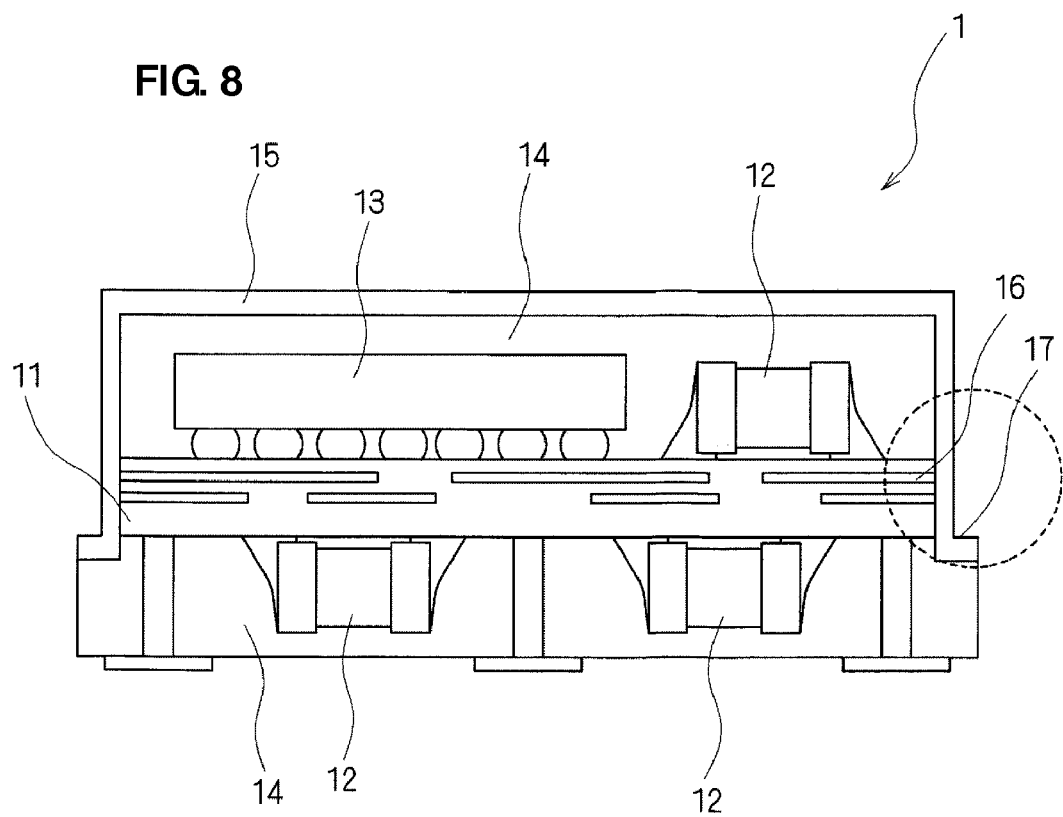
FIG. 8 is a cross-sectional view illustrating the structure of an electronic component module according to a second preferred embodiment of the present invention.

FIG. 8 is a cross-sectional view illustrating the structure of an electronic component module according to a second preferred embodiment of the present invention. The electronic component module 1 according to the second preferred embodiment of the present invention differs from the first preferred embodiment in that electronic components 12 and 13, such as semiconductor elements, capacitors, resistors, SAW filters, for example, are disposed on both sides of a circuit substrate 11 including ceramics, glass, an epoxy resin, or other suitable material, for example.

Both sides of the circuit substrate 11 are provided with a signal pattern (not shown) which also defines a junction pad with the electronic components 12 and 13 and with a grounding electrode 16 exposed adjacent to the circuit substrate 11. The signal pattern of the circuit substrate 11 is connected to the terminals of the electronic components 12 and 13, such as each semiconductor element, capacitor, and resistor, by bonding wires, solder, or other suitable connection, for example.

A sealed resin layer 14 preferably made of a synthetic resin, for example, is provided on the both sides of the circuit substrate 11 so as to cover the circuit substrate 11 and the electronic components 12 and 13. A shield layer 15 is provided on one surface of the sealed resin layer 14 for shielding the electronic components 12 and 13 from electric field noises and electromagnetic wave noises.

The method for manufacturing the electronic component module 1 according to the second preferred embodiment of the present invention is substantially the same as in the first preferred embodiment. More specifically, a sealed resin layer 14 preferably made of a synthetic resin, for example, is formed so as to cover both surfaces of a collective substrate from which a plurality of circuit substrates 11 including a plurality of electronic components 12 and 13 disposed thereon, and groove-shaped cut sections 17 are formed using a blade or other suitable tool, for example, at boundary sections for cutting the electronic component modules 1, so as to reach a depth in the approximate middle of the circuit substrate 11, at which the grounding electrodes 16 are exposed.

Different materials may be used for the synthetic resin of the sealed resin layers 14 for each side of the circuit substrate 11. Furthermore, as the method for forming the sealed resin layers 14, different methods may be used for each side of the circuit substrate 11. For example, when the types or packaging density of the electronic components 12 and 13 are different between the sides of the circuit substrate 11, the synthetic resin may be wrapped adequately around the electronic components on the side with a higher packaging density by changing the type of the synthetic resin used for the resin seal between the sides of the circuit substrate 11 to regulate the flowability, for example, and further by using resin seal methods corresponding to the synthetic resins, thereby improving the resin seal property on the both sides of the circuit substrate 11.

Figure 9A:
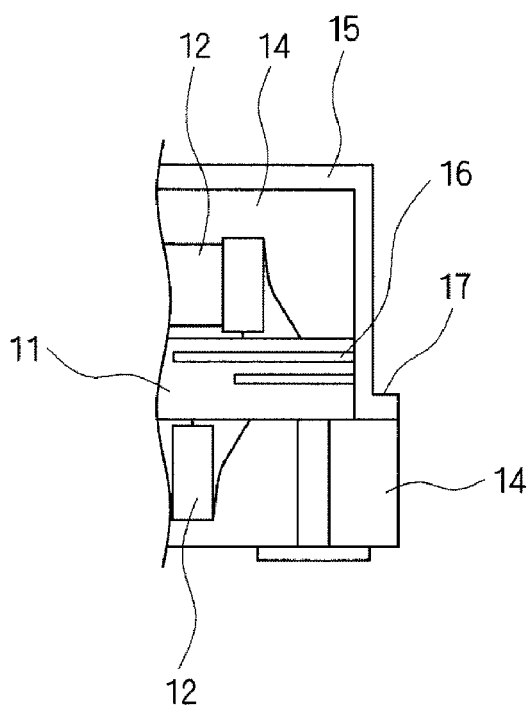
FIGS. 9A and 9B are cross-sectional views illustrating examples of a cut section of an electronic component module according to the second preferred embodiment of the present invention.
Figure 9B:
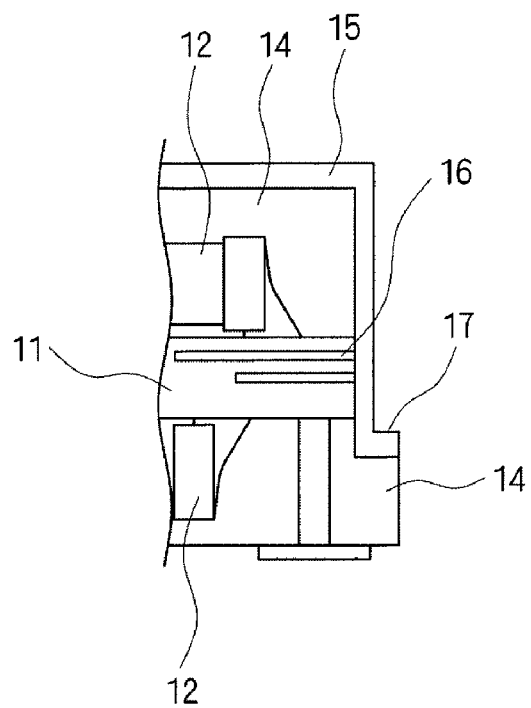

FIGS. 9A and 9B are cross-sectional views illustrating examples of a cut section for the electronic component module 1 according to the second preferred embodiment of the present invention. In the second preferred embodiment of the present invention, the plurality of electronic components 12 and 13 are disposed on both surfaces of a circuit substrate 11, and the sealed resin layer 14 is formed on both sides of a circuit substrate 11. Thus, as shown in FIG. 9A, the cut sections 17 may be formed such that cutting is started from one of the sealed resin layers 14 through the circuit substrate 11 until reaching the other sealed resin layer 14, or as shown in FIG. 9B, the cut sections 17 may be formed through the circuit substrate 11 and further until partially cutting the other sealing resin layer 14.

As in the first preferred embodiment, a conductive paste is applied to the external surface, including the cut sections 17, using a dispenser, a jet dispenser, a vacuum printing apparatus, or other device, for example, and a thin film shield layer is formed preferably by spin coating the conductive paste using a spin coater. Then, the structure is divided at the cut sections 17 into the electronic component modules 1.

As described above, according to the second preferred embodiment, as in the first preferred embodiment, the use of spin coating after the application of the conductive paste on the side surfaces and the top surface of the electronic component modules 1 enables the conductive paste applied on the side surfaces and the top surface of the electronic component modules to be formed into a thin film, resulting in reduction in the generation of gas from vaporization of a diluted solution and gas from a curing reaction of a conductive paste, which are generated during thermal curing. In addition, the small film thickness permits the gases to easily escape therefrom even when these gases are generated, thus preventing the occurrence of voids during thermal curing. Furthermore, the spin coat requires a short time period of approximately 30 s, for example, which increases productivity, and only requires the use of simple and inexpensive equipment, such as a spin coater, thereby reducing production costs.

Third Preferred Embodiment

Figure 10A:
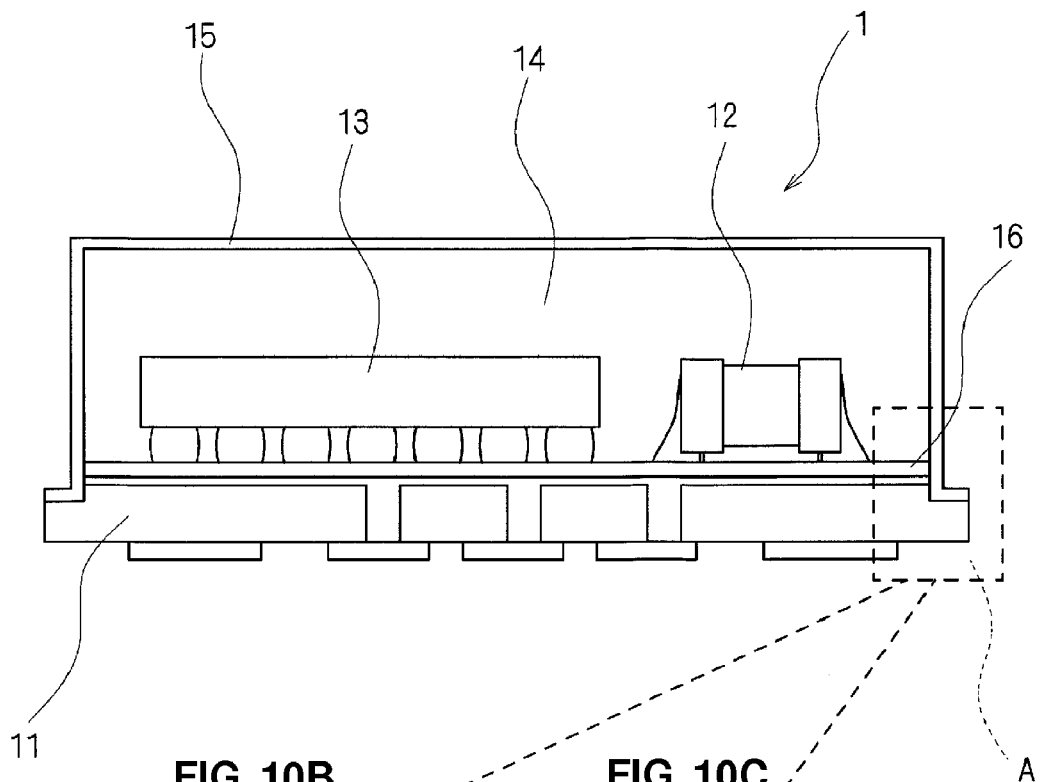
FIGS. 10A to 10C are cross-sectional views illustrating the structure of an electronic component module according to a third preferred embodiment of the present invention.
Figure 10B:
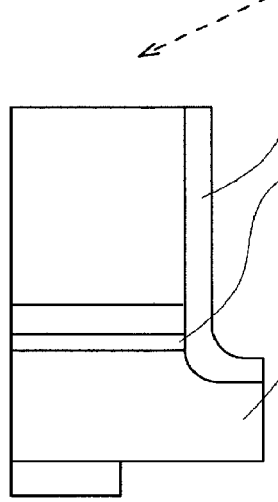
Figure 10C:
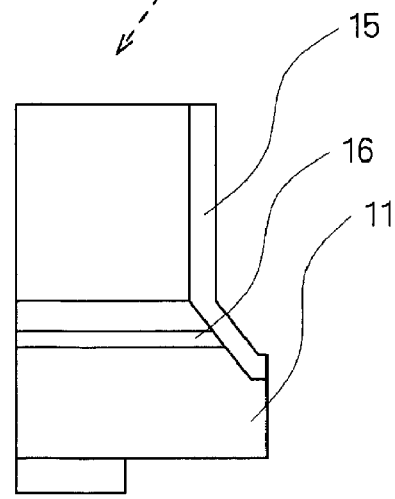

FIGS. 10A to 10C are cross-sectional views illustrating the structure of an electronic component module 1 according to a third preferred embodiment of the present invention. The electronic component module 1 according to the third preferred embodiment of the present invention differs from the first and second preferred embodiments in that the cross-sectional shape around the conductive connection of a grounding electrode 16 to a shield layer 15 near the bottom of a side section is a curved shape or a shape with a predetermined gradient.

FIG. 10A is cross-sectional views illustrating the structure of an electronic component module 1 according to the third preferred embodiment of the present invention. A side section shown in FIG. 10A is a view of the cut sections 17 in FIGS. 3 through 5, showing the shape of an edge section A near the bottom. FIG. 10B is a cross-sectional view illustrating a structure of an edge section of an electronic component module 1 according to the third preferred embodiment of the present invention, whereas FIG. 10C is a cross-sectional view illustrating another structure of an edge section of an electronic component module 1 according to the third preferred embodiment of the present invention.

In FIG. 10B, the cross-sectional shape of the edge section A is preferably a curved shape, for example, a shape having a predetermined radius. Furthermore, in FIG. 10C, the cross-sectional shape of the edge section A is preferably a shape having a predetermined slope, for example, a beveled shape. These shapes are formed by making the cross-sectional shape of the tip of a dicer blade used when forming the cut sections 17 into a curved shape or a beveled shape.

When the cross-sectional shape of the edge section A has a right angle without a curved surface or a predetermined slope, the higher viscosity of the conductive paste or the poorer wettability of the circuit substrate 11 makes it difficult for the conductive paste to enter the edge section, thus resulting in the cut section 17 being insufficiently filled with the conductive paste, and possibly leading to problems such as the occurrence of a portion with no conductive paste applied thereto. Furthermore, there is a possibility that gas from vaporization of a diluted solution or gas from a curing reaction of the conductive paste, which are generated during thermal curing, remains in the section with a right angle cross section.

In contrast, when the cross-sectional shape of the edge section A is a shape having a predetermined radius or a shape having a predetermined slope, the infiltration of conductive paste will increase, thus resulting in the entire cut section 17 being sufficiently filled with the conductive paste, and preventing a portion in which no conductive paste is applied. Furthermore, gas from vaporization of a diluted solution and gas from a curing reaction of the conductive paste will easily escape therefrom without accumulating in the edge section, thus preventing a portion in which no conductive paste is applied. It is to be noted that the subsequent steps preferably are the same or substantially the same as in the first and second preferred embodiments.

Fourth Preferred Embodiment

Figure 11:
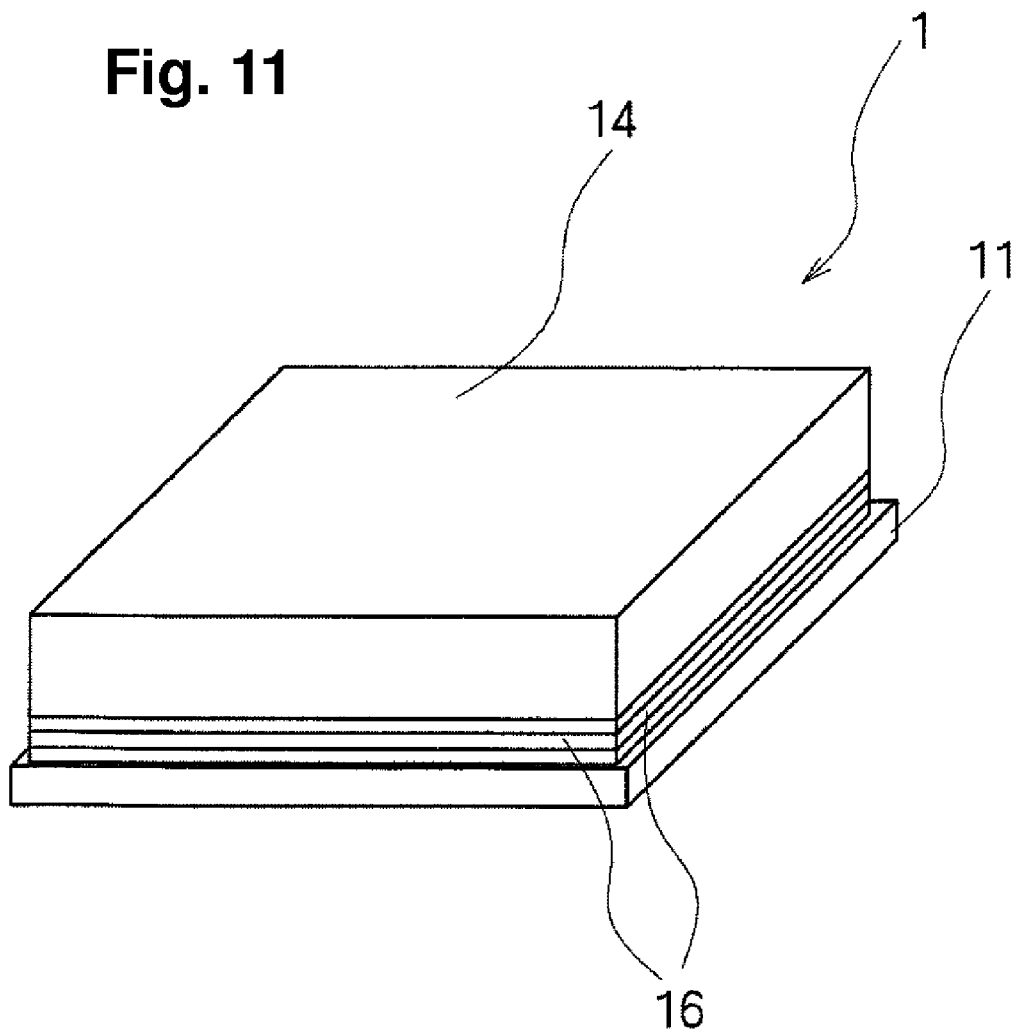
FIG. 11 is a perspective view illustrating the structure of an electronic component module according to a fourth preferred embodiment of the present invention.

FIG. 11 is a perspective view illustrating the structure of an electronic component module 1 according to a fourth preferred embodiment of the present invention. The electronic component module 1 according to the fourth preferred embodiment of the present invention differs from the first, second, and third preferred embodiments in that the grounding electrodes 16 are provided on all of four side surfaces of a peripheral section.

FIG. 11 shows a state in which a shield layer is omitted in order to make the grounding electrodes 16 visible. As shown in FIG. 11, the grounding electrodes 16 are formed on each of the four sides of the circuit substrate 11. The grounding electrodes 16 formed on each of the four sides enable electronic components, internal wirings, and other circuit elements sealed with a resin to be effectively protected.

Furthermore, if grounding electrodes 16 are formed on the upper surface of the circuit substrate 11, the area of a region in which electronic components can be located will be reduced, making it difficult to reduce the size of the main body of the electronic component module 1. In contrast, the grounding electrodes 16 are formed on the four side surfaces of the circuit substrate 11, thus enabling the size of the main body of the electronic component module 1 to be reduced while not reducing the size of the region in which electronic components can be disposed.

Moreover, when the shield layer is made into a thin film by a spin coater, a centrifugal force due to the rotation of the rotor 3 will apply a stronger force to side surfaces outside the spin coater among the side surfaces of the electronic component module 1 in a direction in which the conductive paste is peeled. Therefore, among individual electronic component modules, there is a strong tendency to form a shield layer in which the side surfaces opposed to the center of rotation of the spin coater have an increased film thickness and the side surfaces along the periphery have a decreased film thickness.

However, in the fourth preferred embodiment, the grounding electrodes 16 are formed on all of the four side surfaces of the electronic component module 1. Thus, even if the reduced film thickness of the shield layer 15 results in a side surface which provides insufficient shielding, a shield layer 15 with a sufficient film thickness can be formed on any of the other side surfaces. Therefore, any of the grounding electrodes 16 formed on the four side surfaces can be effectively grounded, so as to ensure the shielding property.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing an electronic component module, comprising:
    batch-sealing, with a resin, a collective substrate including a plurality of electronic component modules including a plurality of components;
    forming a cut section from a top surface of the sealed resin to a position that reaches a grounding electrode arranged in the collective substrate at a boundary section of the plurality of electronic component modules so as to expose the grounding electrode; and
    applying a conductive paste on side surfaces and a top surface of the plurality of electronic component modules, and then cutting the electronic component modules along the cut section; wherein
    a conductive thin film is formed by spin coating after applying the conductive paste.

2. The method for manufacturing an electronic component module according to claim 1, wherein a cross-sectional shape in a direction substantially perpendicular to the cut section at a bottom of the cut section is a curved shape or a shape having a predetermined slope.

3. The method for manufacturing an electronic component module according to claim 1, wherein the grounding electrode of the collective substrate exposed in the step of forming a cut is formed on each of four side surfaces of the electronic component module.

* * * * *